(12) United States Patent
Kheng (10) Patent No.: US 7,262,499 B2
(45) Date of Patent: Aug. 28, 2007

(54) SEMICONDUCTOR PACKAGES (75) Inventor: Lee Teck Kheng, Singapore (SG)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/264,972

(22) Filed: Nov. 2, 2005

(65) Prior Publication Data

US 2006/0055052 A1 Mar. 16, 2006

Related U.S. Application Data

(62) Division of application No. 10/825,839, filed on Apr. 15, 2004.

(51) Int. Cl.
*H01L 33/48* (2006.01)
(52) U.S. Cl. ...................................... 257/738
(58) Field of Classification Search ........ 257/734–738, 257/759, 777–778, 783, E23.125, 724, 690
See application file for complete search history.

(56) References Cited

U.S. PATENT DOCUMENTS

| | | | |
|---|---|---|---|
| 5,527,741 A * | 6/1996 | Cole et al. ................ 438/107 |
| 5,659,198 A | 8/1997 | Okutomo et al. | |
| 5,661,088 A | 8/1997 | Tessier et al. | |
| 5,880,017 A * | 3/1999 | Schwiebert et al. ........ 438/613 |
| 5,888,849 A | 3/1999 | Johnson | |
| 5,945,741 A | 8/1999 | Ohsawa et al. | |
| 5,973,393 A | 10/1999 | Chia et al. | |
| 5,987,744 A | 11/1999 | Lan et al. | |
| 6,087,717 A * | 7/2000 | Ano et al. ................ 257/684 |
| 6,144,102 A | 11/2000 | Amagai | |
| 6,232,661 B1 * | 5/2001 | Amagai et al. ............ 257/737 |
| 6,265,782 B1 * | 7/2001 | Yamamoto et al. ......... 257/783 |
| 6,379,159 B1 * | 4/2002 | Mune et al. ................ 439/71 |
| 6,432,746 B2 | 8/2002 | Kim et al. | |
| 6,486,544 B1 | 11/2002 | Hashimoto | |
| 6,489,687 B1 | 12/2002 | Hashimoto | |
| 6,621,172 B2 | 9/2003 | Nakayama et al. | |
| 6,686,656 B1 | 2/2004 | Koh et al. | |
| 6,876,074 B2 * | 4/2005 | Kim ......................... 257/686 |
| 6,879,492 B2 * | 4/2005 | Alcoe et al. ............... 361/748 |
| 6,882,042 B2 | 4/2005 | Zhao et al. | |
| 6,887,779 B2 * | 5/2005 | Alcoe et al. ............... 438/620 |
| 6,977,441 B2 | 12/2005 | Hashimoto | |
| 6,998,704 B2 | 2/2006 | Yamazaki et al. | |

* cited by examiner

*Primary Examiner*—Nathan W. Ha
(74) *Attorney, Agent, or Firm*—Wells St. John, P.S.

(57) ABSTRACT

The invention includes semiconductor packages having a patterned substrate with openings extending therethrough, conductive circuit traces over the substrate and having portions extending over the openings, a semiconductor die over the circuit traces, and a matrix contacting the circuit traces and also contacting the die. The invention also includes methods of forming semiconductor packages. Such methods can include provision of a construction comprising an electrically conductive layer on a masking material. The layer has a first surface facing the masking material and a second surface in opposing relation to the first surface. The masking material is patterned to form openings extending to the first surface of the layer. The layer is then patterned. Subsequently, an integrated circuit die is provided over the second surface of the layer.

3 Claims, 8 Drawing Sheets

Fig. 24

SEMICONDUCTOR PACKAGES

RELATED PATENT DATA

This patent resulted from a divisional of U.S. patent application Ser. No. 10/825,839, filed Apr. 15, 2004, which is hereby incorporated by reference.

TECHNICAL FIELD

The invention pertains to semiconductor packages, and to methods of forming semiconductor packages.

BACKGROUND OF THE INVENTION

Semiconductor devices (for example, dynamic random access memory (DRAM) devices), are shrinking in the sense that smaller devices are being manufactured that are able to handle larger volumes of data and faster data transfer rates. Semiconductor manufacturers have been moving toward chip-scale packages (CSP) for semiconductor components having a small size and fine pitch wiring.

Figure 1:
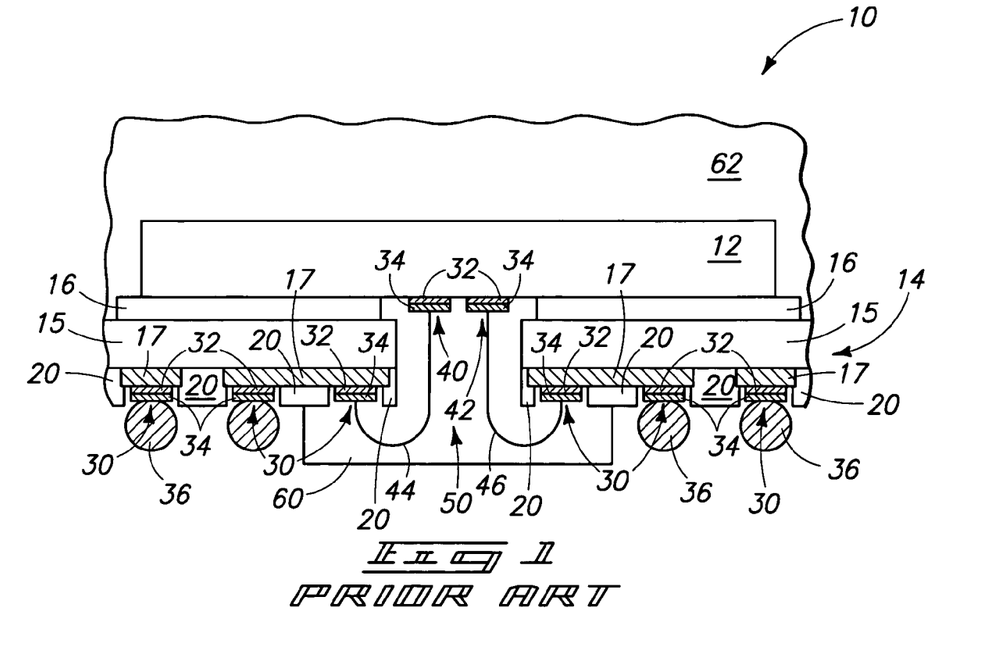
FIG. 1 is a diagrammatic, cross-sectional side view of a prior art board-on-chip semiconductor package construction.

An exemplary CSP is shown in FIG. 1 as a board-on-chip (BOC) package 10. The package comprises a semiconductor component 12, such as an integrated circuit chip (or die), and accordingly the package can be referred to as a semiconductor package.

The package 10 comprises an interposer 14 utilized to support the semiconductor component 12. The shown interposer comprises a board 15, dielectric (i.e., electrically insulative) material 20 on one side of the board and circuitry 17 on another side of the board. Board 15 can be, for example, a glass weave material. Chip 12 is attached to the board 15 through an adhesive structure 16. The adhesive structure can be, for example, a cured glue, paste, or other polymeric matrix. As another example, the adhesive structure can be a tape. Such tape can have one side adjacent board 15 and an opposing side adjacent integrated circuit die 12, and adhesive can be along both of the opposing sides of the tape.

Dielectric material 20 is patterned to have a plurality of openings extending therethrough to the circuitry 17. Material 20 can comprise, for example, a photomask material, such as, for example, a dry film photomask. If material 20 is a photomask material, the material 20 can be patterned by photolithography. Specifically, the material can be patterned by exposing the material to a pattern of radiation and subsequently utilizing a developing solvent to impart the desired pattern within material 20.

A series of contact pads 30 are provided within the openings in dielectric material 20, and specifically are provided along a surface of circuitry 17 which is exposed within the openings. The contact pads 30 comprise a first conductive material 32 adjacent circuitry 17, and a second conductive material 34 over the first conductive material. Typically, conductive material 32 will be a nickel-containing material, and accordingly can comprise, consist essentially of, or consist of nickel; and material 34 will be a gold-containing material, and accordingly can comprise, consist essentially of, or consist of gold.

The contact pads are utilized for forming electrical contact to circuitry external of the contact pads. Solder balls 36 are shown attached to some of the contact pads, and the solder balls can then be utilized for electrically connecting the solder pads with other circuitry (not shown) external of the contact pads.

A pair of contact pad locations 40 and 42 are shown associated with integrated circuit die 12. Contact pad locations 40 and 42 comprise the nickel-containing material 32 and gold-containing material 34 of contact pads 30, but it is to be understood that contact pad locations 40 and 42 can also comprise other constructions. A pair of wires 44 and 46 are shown extending from contact pad locations 40 and 42, respectively, to a pair of the contact pads 30. The wires connect circuitry associated with integrated circuit die 12 to the circuitry of patterned conductive material 17, and can be referred to as wire bonds.

A slit 50 extends through the interposer 14, and the wires 44 and 46 extend through such slit to make the electrical contact with the contact pads 30.

An encapsulant 60 is provided within the slit 50, and over the wires 44 and 46 to protect the wires of package 10. Similarly, an encapsulant 62 is provided over integrated circuit die 12, adhesive structure 16 and board 15 to provide a protective covering over the semiconductor package.

The shown package of FIG. 1 is but one of several types of packages that can be formed in accordance with prior art methodologies. For instance, although the openings extending through insulative material 20 are shown to be wider than the contact pads (consistent with non-solder mask defined (NSMD) technologies), the openings could also be formed to be smaller than the contact pads (consistent with solder mask defined (SMD) pad technologies).

The package design of FIG. 1 can have various problems associated with the utilization of the interposer 14. Such problems can include size limitations imposed by the size of the interposer. The problems can also include negative performance properties induced by the interposer through, for example, adsorption of moisture by the interposer and/or outgassing of materials from the interposer. Accordingly, it is desired to develop new semiconductor packages.

SUMMARY OF THE INVENTION

In one aspect, the invention encompasses a semiconductor package having an interposer which contains only a single dielectric support member. The interposer also contains conductive circuit traces contacting the single dielectric support member. The package further includes a semiconductor die electrically connected with at least one of the traces. The traces are between the semiconductor die and the single dielectric support member.

In one aspect, the invention encompasses another semiconductor package. The package includes a patterned substrate having openings extending through it. The package also includes conductive circuit traces over the substrate and having portions extending over the openings. Additionally, the package includes a semiconductor die over the circuit traces, and an adhesive structure (which can also be referred to as an adhesive fastener) touching the circuit traces and touching the die.

In one aspect, the invention encompasses a method of forming a semiconductor package. A construction is provided which has an electrically-conductive expanse over a first dielectric material. The electrically-conductive expanse has a first surface facing the first dielectric material and a second surface in opposing relation to the first surface. A pattern of openings is formed, with the openings extending through the first dielectric material to expose regions of the first surface of the electrically-conductive expanse. Contact pad material is plated onto the exposed regions of the first surface of the electrically-conductive expanse. The electrically-conductive expanse is then patterned into one or more circuit traces. After the electrically-conductive expanse is patterned, a second dielectric material is provided in direct contact with the second surface of the expanse, and an integrated circuit die is provided over the second dielectric material.

BRIEF DESCRIPTION OF THE DRAWINGS

Preferred embodiments of the invention are described below with reference to the following accompanying drawings.

FIG. 3 is a view along the lines 3-3 of FIGS. 4 and 5.

FIG. 9 is a view along the lines 9-9 of FIGS. 10 and 11.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

An exemplary aspect of the invention is described with reference to FIG. 2. In referring to FIG. 2, similar numbering will be used as is utilized above in describing the prior art semiconductor package of FIG. 1, where appropriate.

Figure 2:
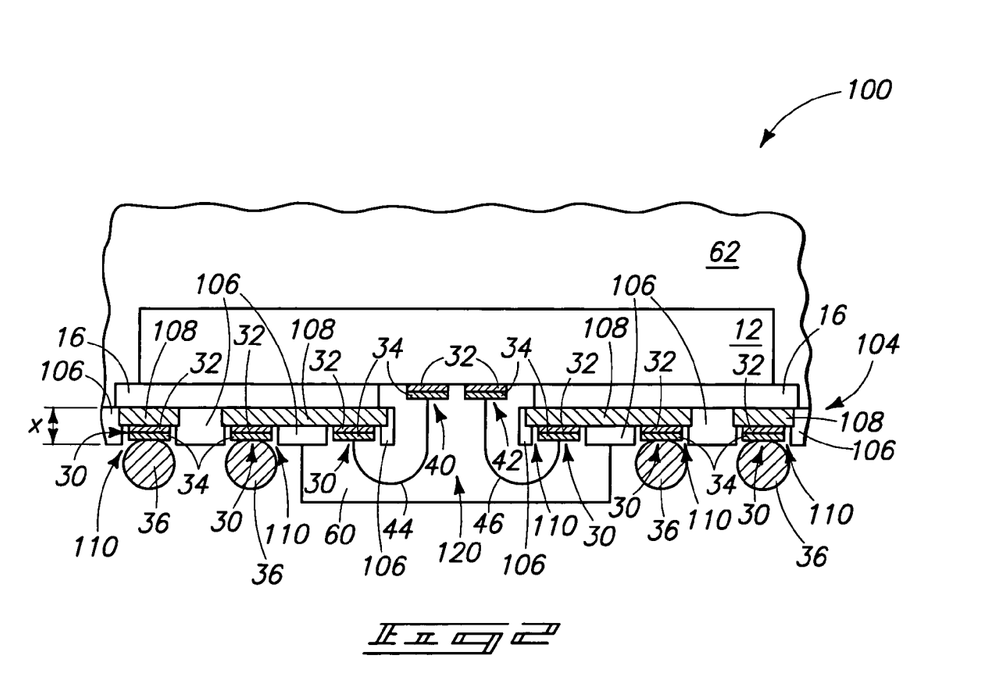
FIG. 2 is a diagrammatic cross-sectional side view of a board-on-chip semiconductor package construction formed in accordance with an exemplary aspect of the present invention.

FIG. 2 shows a semiconductor package 100 comprising an integrated circuit die (which can also be referred to herein as a semiconductor die) 12. The die is adhered to an interposer construction 104 through an electrically insulative adhesive structure 16. The interposer 104 can be referred to as a frame carrier interposer, to emphasize that the interposer is carrying the circuit trace frame.

The interposer 104 differs from the interposer 14 of FIG. 1, in that the interposer 104 is missing the core 15 described previously. Specifically, interposer 104 comprises a patterned support material 106 and electrically conductive circuit traces 108 over the support material. The support material 106 can be any suitable material, and in particular aspects will comprise, consist essentially of, or consist of polyimide or liquid polymer crystal. In some aspects, material 106 can comprise, consist essentially of, or consist of a photomask material, such as, for example, a dry film photomask. Exemplary dry film photomask materials are PSR 800™ from Taiyo, Pyralux PC1000™ from Dupton, and CFP1123™ from Sumitomo Bakelite.

The circuit traces 108 can comprise any suitable electrically conductive material or combination of materials, and in particular aspects will comprise, consist essentially of, or consist of copper.

The support member 106 is patterned to have openings 110 extending therethrough to a surface of the electrically conductive traces 108. Traces 108 can be considered to have first surfaces on the bottom side of the traces in the shown configuration of FIG. 2, and second surfaces on the top side of the traces and in opposing relation to the bottom surfaces; with portions of the first surfaces extending over the openings.

Contact pads 30 (only some of which are labeled in the illustration of FIG. 2) are within the openings 110 and electrically connected with the conductive circuit traces 108. In the shown aspect of the invention, the contact pads 30 comprise the layers 32 and 34 discussed previously. Accordingly the contact pads comprise a nickel-containing material along bottom surfaces of circuit traces 108 and a gold-containing material along the nickel-containing material. Solder balls 36 are shown electrically connected with the contact pads, and accordingly are electrically connected with circuit traces 108 through the contact pads. One or both of the solder balls and the contact pads can be referred to as electrically-conductive connectors extending within the openings 110, and in electrical connection with the circuit traces.

The shown openings 110 of FIG. 2 correspond to an NSMD application, but it is to be understood that the invention can also be utilized with SMD applications. It can be preferred to use SMD.

The integrated circuit die 12 has contact pads 40 and 42 associated therewith, and wire bonds 44 and 46 extend from the pads 40 and 42, respectively, to electrically connect with a pair of the contact pads 30.

The adhesive structure 16 utilized to adhere integrated circuit die 12 to interposer 104 can comprise any suitable material or combination of materials. In some aspects, adhesive structure 16 can be a homogeneous matrix which physically contacts (i.e., touches) the circuit traces 108 and an underside of die 12. The homogeneous matrix can correspond to a cured paste, epoxy, glue etc., and in particular aspects will be a polymeric matrix. Alternatively, the adhesive structure 16 can comprise a tape having opposing sides, with one of the sides being proximate an underside of die 12 and the other sides being proximate circuit traces 108. The tape can have adhesive on both of the opposing sides, with the adhesive on the upper side of the tape being in physical contact with an underside of die 12, and the adhesive on a lower side of the tape being in physical contact with circuit traces 108. The adhesive structure 16 utilized with various aspects of the invention can be, for example, tape adhesive exemplified by Ablestik™ 5405SI™ and DF400™ from Hitachi Cable, or printable B-stage paste exemplified by Cookson™ Staystik 383™, SMM CRM-X2070™, etc.

The interposer 104 has a slit 120 extending therethrough. The wire bonds 44 and 46 extend downwardly from contact pads 40 and 42, through the slit, and then upwardly into openings 110 to contact the contact pads 30 and thereby electrically connect with two of the circuit traces. Although the wire bonds are shown connected to two of the circuit traces, it is to be understood that the wire bonds can connect with more than two or less than two of the circuit traces. Also, although only two wire bonds are shown, it is to be understood that more than two wires bonds or less than two wire bonds can be utilized.

The interposer 104 of FIG. 2 differs from the interposer 14 of FIG. 1, in that the interposer 104 contains only a single dielectric support member (106), whereas the interposer 14 contained two dielectric support members (15 and 20). Further, the construction 100 of FIG. 2 differs from the construction 10 of FIG. 1 in that adhesive structure 16 is provided in contact with circuit traces 108, as well as the underside of integrated circuit die 12 in the construction 100 of FIG. 2, whereas the adhesive structure 16 did not contact the circuit traces 17 of the prior art construction 10 of FIG. 1. Instead, the adhesive structure 16 was spaced from the circuit traces 17 by the dielectric material 15 of interposer 14.

The interposer 104 of the present invention can be advantageous over the interposer 14 of the prior art for numerous reasons. For instance, the interposer 104 can be formed to be much thinner than prior art interposers, which can enable semiconductor packages to be formed which consume less space than the prior art semiconductor packages. Also, the thin interposer of the present invention can be flexible, which can aid in manufacturing and use of the interposers of the present invention. Interposer 104 has a thickness "X" from an uppermost surface of the interposer (specifically an uppermost surface of circuit trace 108 in the shown aspect of the invention) to a lowermost surface (specifically a bottom surface of dielectric 106 in the shown aspect of the invention). In exemplary applications, such thickness can be from about 15 micrometers to about 150 micrometers, with a typical thickness being about 50 micrometers.

The encapsulants 60 and 62 of the prior art package 10 (FIG. 1) can be utilized in the package 100 of the present invention, as shown in FIG. 2. The encapsulants 60 and 62 can be the same as one another or different, and in exemplary applications are both the same transfer molding liquid encapsulant.

Figure 3:
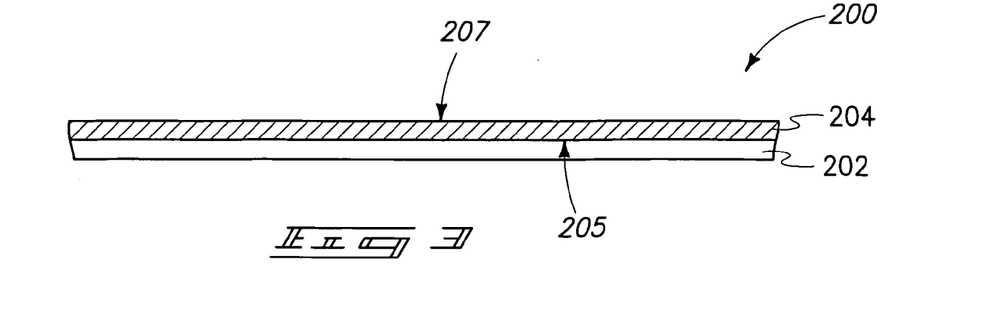
FIGS. 3-5 are a diagrammatic cross-sectional side view, fragmentary top view, and fragmentary bottom view of an interposer assembly at a preliminary processing stage of an exemplary aspect of the present invention.
Figure 4:
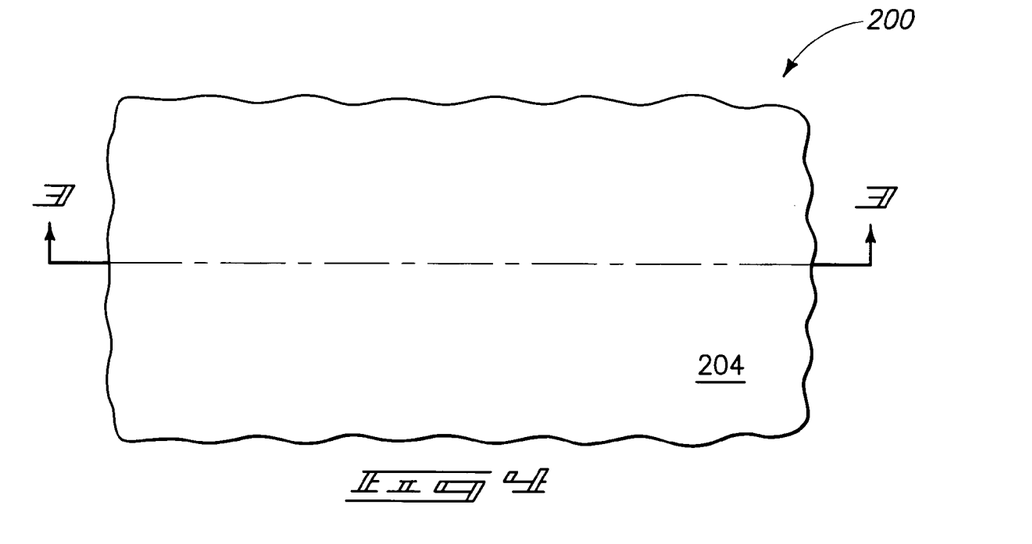
Figure 5:
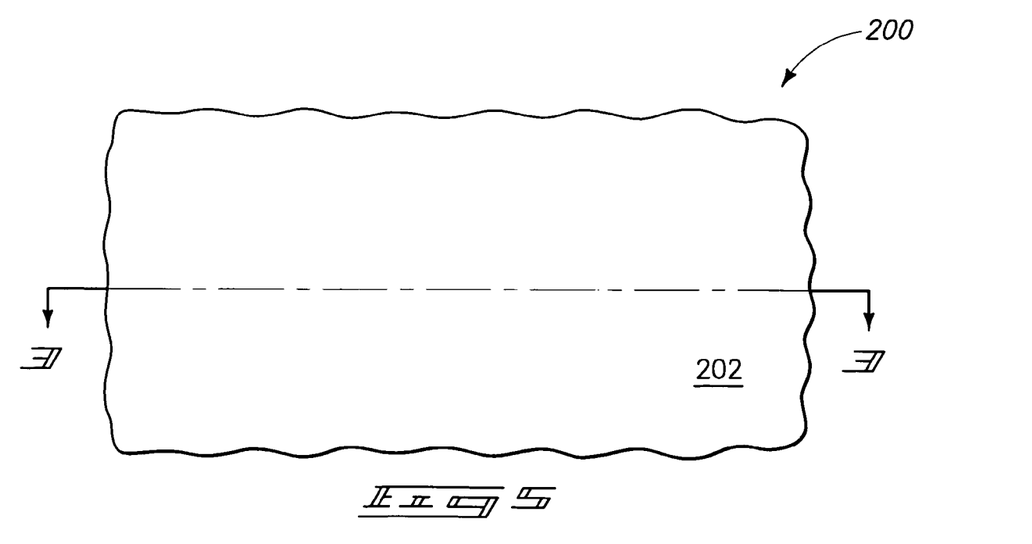

The construction of FIG. 2 can be formed by any suitable method. An exemplary method is described with reference to FIGS. 3-20. Referring initially to FIGS. 3-5, an interposer structure 200 is illustrated at a preliminary processing stage. Structure 200 comprises a dielectric material 202 laminated to a conductive material 204. The conductive material 204 can be considered to comprise a pair of opposing surfaces 205 and 207, with the surface 205 facing and contacting dielectric material 202.

The material 204 can be referred to as an electrically-conductive expanse. Such electrically-conductive expanse can be homogeneous, as shown, or can comprise multiple different electrically-conductive components. If the material 204 comprises different electrically-conductive components, the components can be in any appropriate orientation, and in particular aspects can be stacked as multiple electrically-conductive layers. Conductive structure 204 can comprise any suitable electrically conductive material, or combination of materials, and in particular aspects will comprise, consist essentially of, or consist of copper. Conductive material 204 is ultimately utilized to form circuit traces, such as, for example, the traces 108 of FIG. 2.

Dielectric material 202 can comprise any suitable material or combination of materials, and in some aspects can be referred to as a masking material and/or base material. In particular aspects, dielectric material 202 will comprise, consist essentially of, or consist of a photosensitive mask, such as, for example, a dry film photomask. The material 202 can be 50 micrometer polyimide film, or photomask dry film, for instance. Dielectric material 202 is utilized to form the dielectric support of an interposer of the present invention, such as, for example, the support 106 of FIG. 2.

The dielectric material 202 and conductive material 204 can be laminated to one another utilizing conventional methodologies. For instance, if electrically-conductive material 204 comprises a copper foil and dielectric material 202 comprises a dry film photomask, the materials 202 and 204 can be laminated to one another utilizing conventional methodologies for laminating dry film photomasks to metallic foils.

Figure 6:
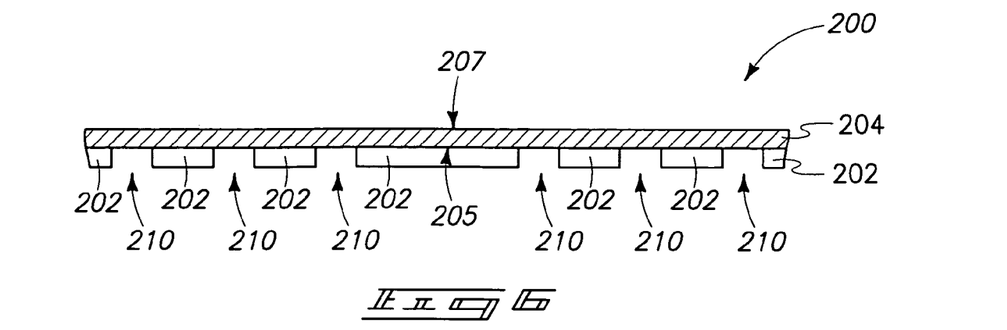
FIGS. 6-8 are a diagrammatic cross-sectional side view, fragmentary top view and fragmentary bottom view, respectively, of the interposer assembly of FIGS. 3-5 shown at a processing stage subsequent to that of FIGS. 3-5. The view of FIG. 6 is along the lines 6-6 of FIGS. 7 and 8.
Figure 7:
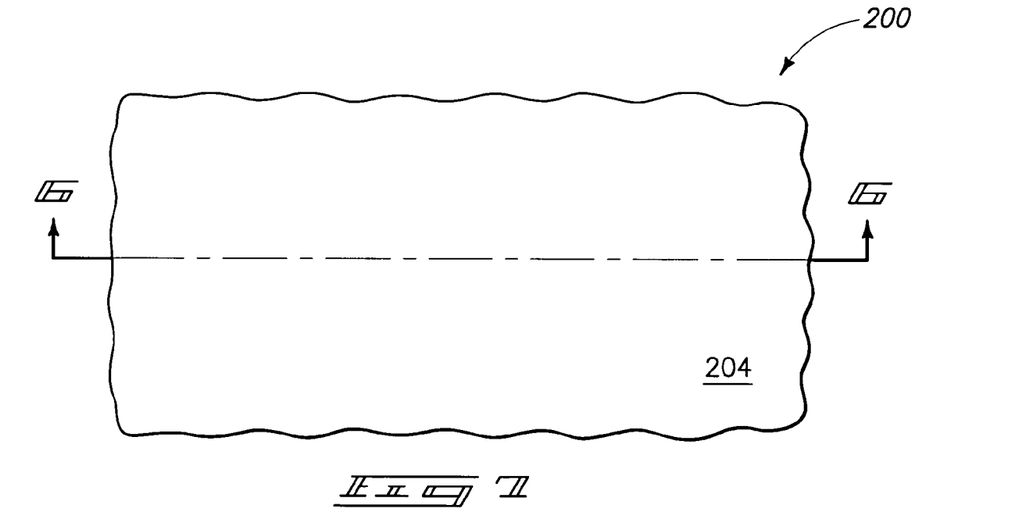
Figure 8:
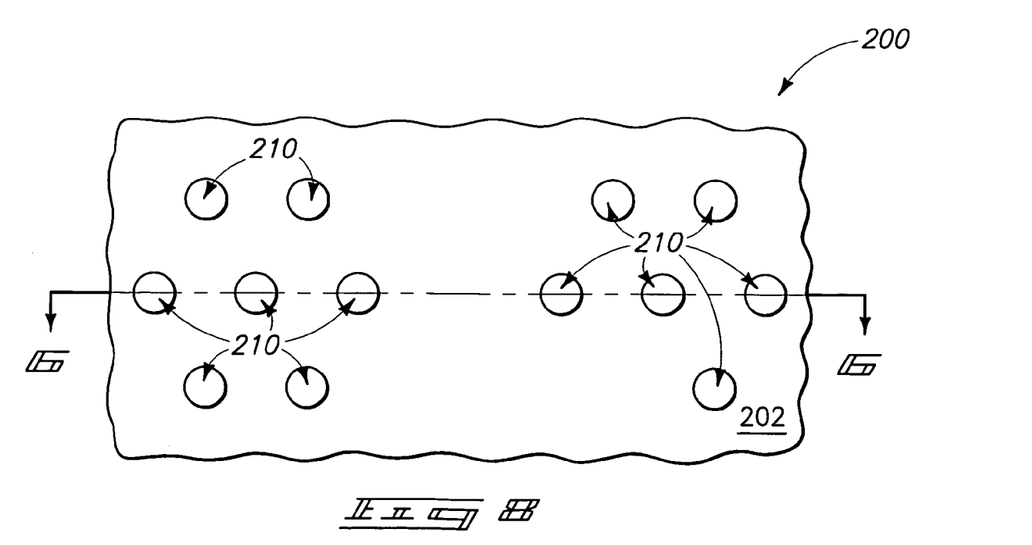

Referring next to FIGS. 6-8, dielectric material 202 is patterned to form a plurality of openings 210 extending through material 202 to the surface 205 of electrically-conductive material 204. If material 202 comprises a photomask, the masking material 202 can be patterned with photolithographic processing. Specifically, material 202 can be exposed to a suitable pattern of radiation, and then to an appropriate solvent (i.e., developer) to selectively remove either exposed or unexposed portions of the material 202 and leave a desired pattern remaining in material 202.

Figure 9:
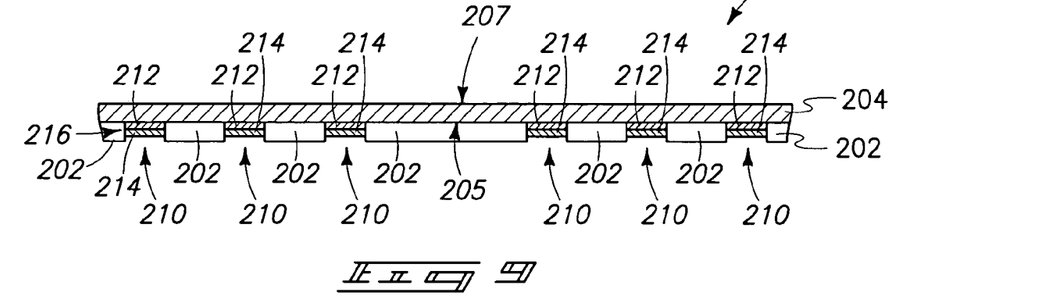
FIGS. 9-11 are a diagrammatic cross-sectional side view, fragmentary top view and fragmentary bottom view of the interposer assembly of FIGS. 3-5 shown at a processing stage subsequent to that of FIGS. 6-8.
Figure 10:
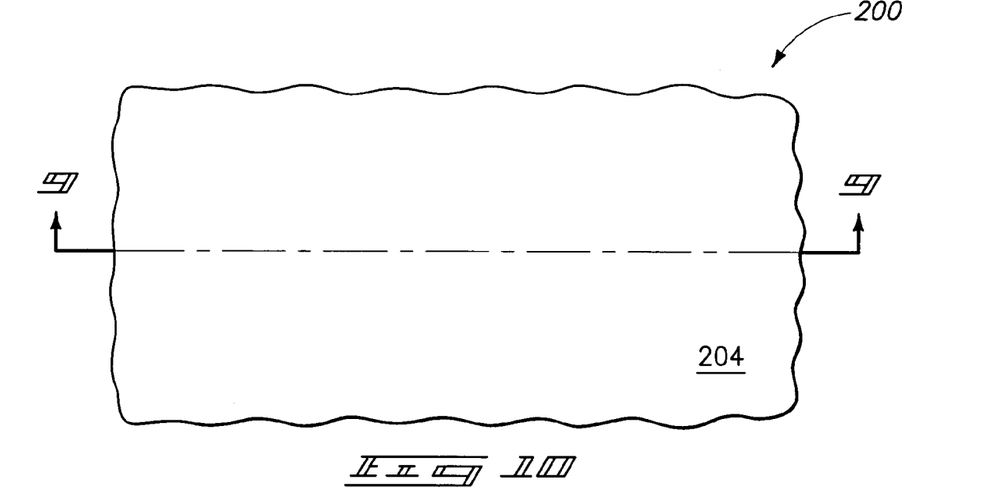
Figure 11:
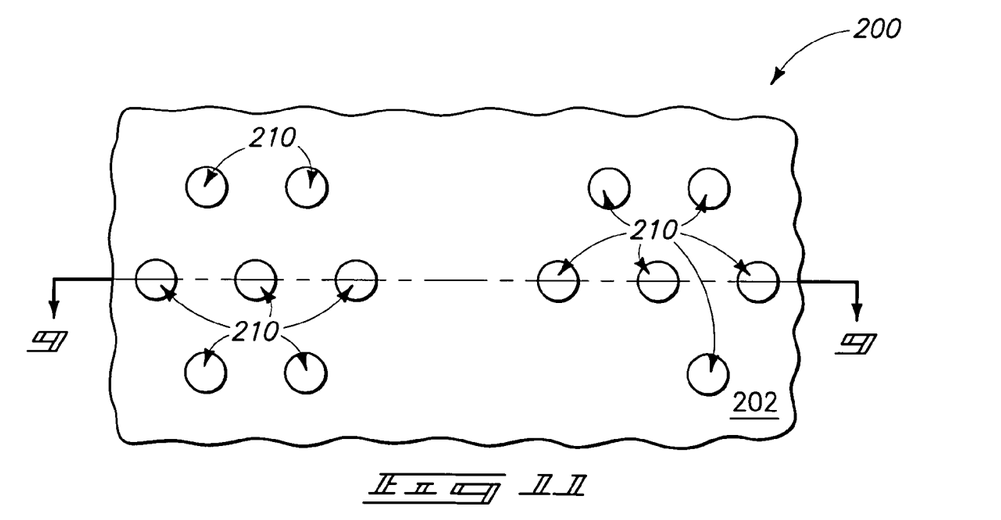

Referring next to FIGS. 9-11, construction 200 is shown in cross-sectional view, top view and bottom view, respectively, at a processing stage subsequent to that of FIGS. 6-8. Layers 212 and 214 are formed on surface 205 of electrically-conductive material 204. Specifically, layers 212 and 214 are formed on regions of surface 205 exposed within the openings 210 extending through dielectric substrate 202.

Layers 212 and 214 are electrically-conductive, and can be identical to the layers 32 and 34 described previously with reference to FIGS. 1 and 2. Accordingly, layer 212 can be a nickel-comprising layer and in particular aspects can comprise, consist essentially of, or consist of nickel; and layer 214 can be a gold-containing layer, and in particular aspects can comprise, consist essentially of, or consist of gold. Layers 212 and 214 form contact pads 216 (only one of which is labeled in FIG. 9) within the openings 210, and electrically connected with conductive material 204. The layers 212 and 214 can accordingly be referred to as contact pad material. In some aspects of the invention, a finish can be applied to the contact pads, such as, for example, an Organic Solderability Preservative (OSP) coating or palladium finish to improve wetability for solder balls and wafer bond purposes.

Layers 212 and 214 can be formed by any suitable method, but electrolytic plating can be a preferred method for forming the layers. Specifically, construction 200 can be immersed in a bath comprising appropriate ions, and an electrical potential can be passed through layer 204 to electrolytically plate layer 212 onto an exposed surface of layer 204. Subsequently, the ions in the bath can be changed, and then layer 214 can be formed by electrolytic plating onto an exposed surface of layer 212. The surface 207 of layer 204 can be protected during the electrolytic plating of layers 212 and 214 to avoid formation of the layers 212 and 214 on the surface 207. Alternatively, or additionally, to the extent that any of materials 212 and 214 form over surface 207, such materials can be moved by polishing and/or other appropriate processing.

Figure 12:
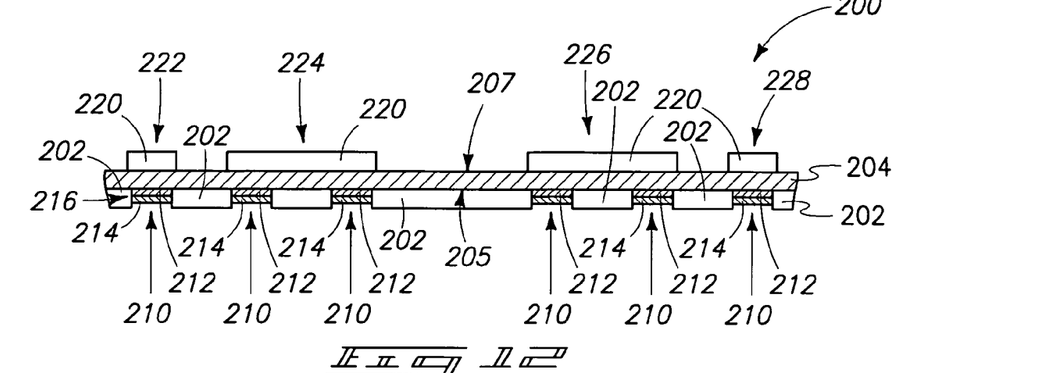
FIGS. 12-14 are a diagrammatic cross-sectional side view, fragmentary top view and fragmentary bottom view, respectively, of the interposer assembly of FIGS. 3-5 shown at a processing stage subsequent to that of FIGS. 9-11. The view of FIG. 12 is along the lines 12-12 of FIGS. 13 and 14.
Figure 13:
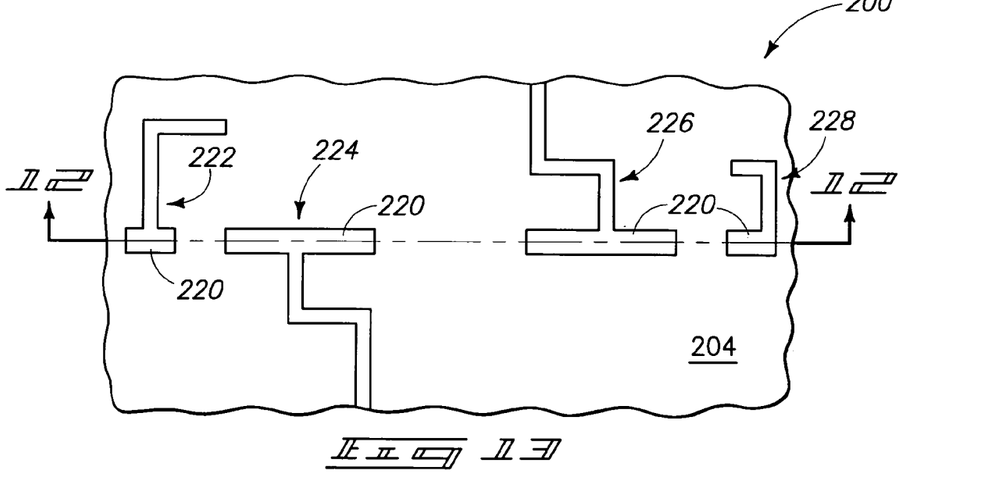
Figure 14:
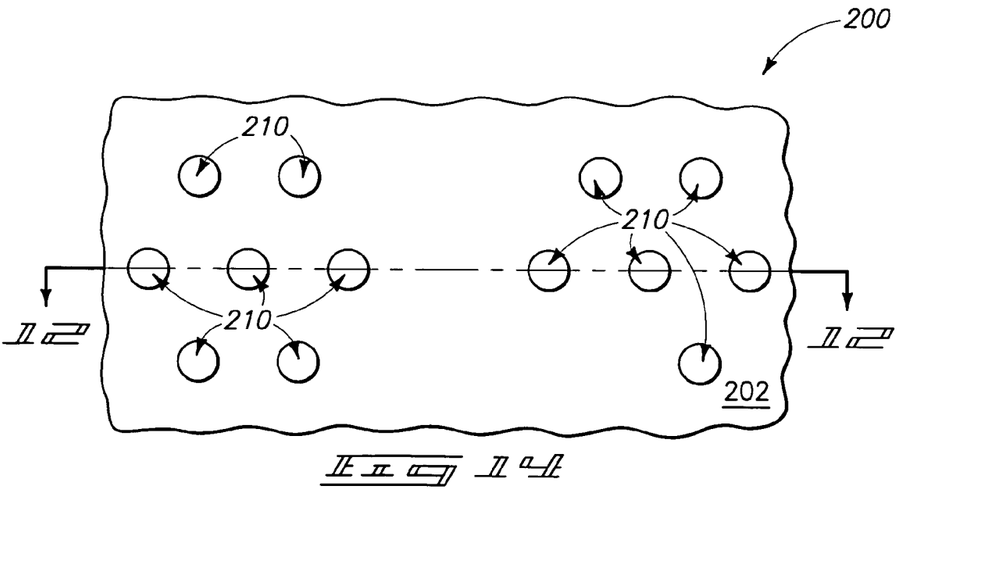

Referring next to FIGS. 12-14, such show a diagrammatic cross-sectional side view, top view and bottom view, respectively, of the semiconductor construction 200 at a processing stage subsequent to that of FIGS. 9-11. Specifically, a patterned mask 220 is formed over the upper surface 207 of electrically-conductive expanse 204. Mask 220 defines a plurality of circuit trace patterns 222, 224, 226 and 228. Mask 220 can comprise any suitable material, and in particular aspects will comprise, consist essentially of, or consist of a photolithographically patterned dry film photomask.

Figure 15:
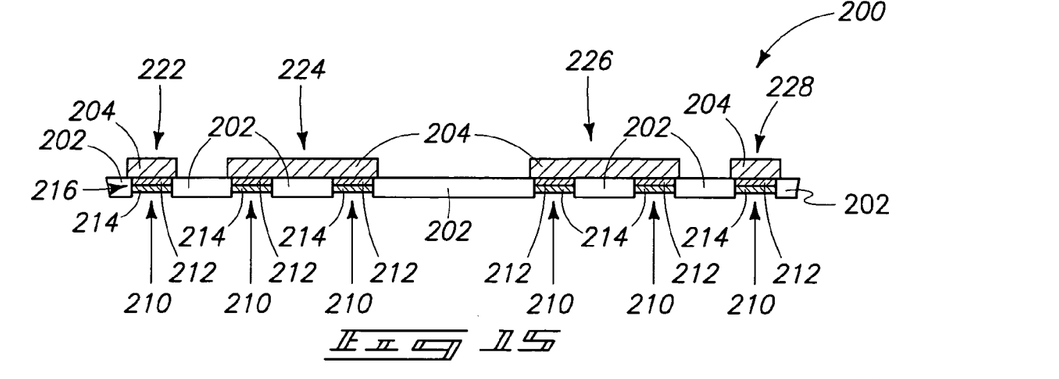
FIGS. 15-17 are a diagrammatic cross-sectional side view, fragmentary top view and fragmentary bottom view of the interposer assembly of FIGS. 3-5 shown at a processing stage subsequent to that of FIGS. 12-14. The view of FIG. 15 is along the lines 15-15 of FIGS. 16 and 17.
Figure 16:
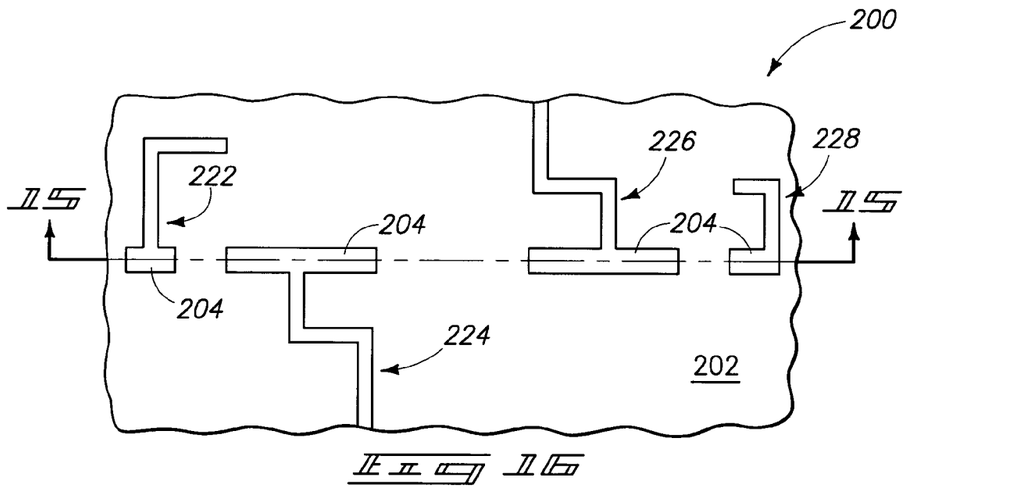
Figure 17:
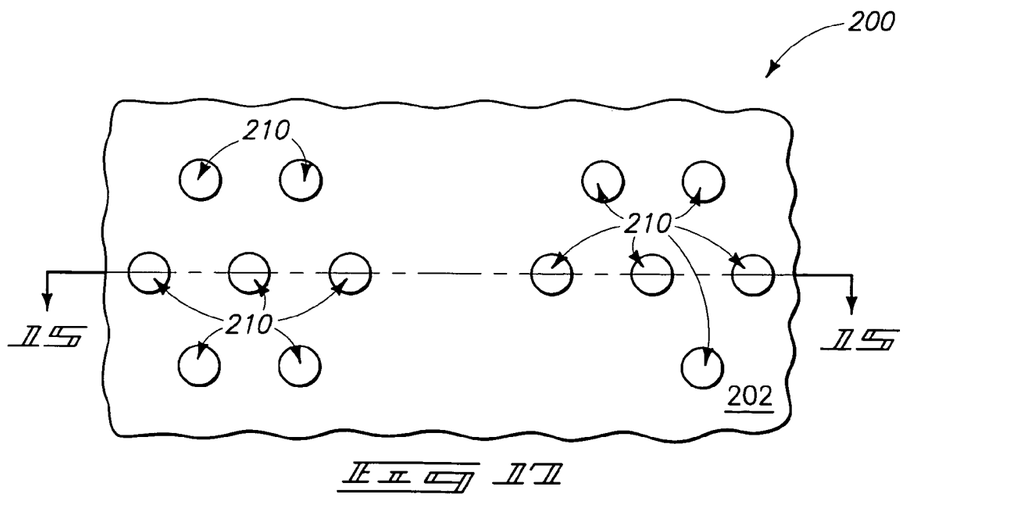

Referring next to FIGS. 15-17, construction 200 is shown in cross-sectional view, top view and bottom view, respectively, after a pattern is transferred from mask 220 (FIGS. 12 and 13) to underlying conductive material 204, and the mask 220 has been subsequently removed. Accordingly, conductive material 204 has been patterned into the circuit trace patterns 222, 224, 226 and 228 defined by the masking material 220 (FIG. 13). The patterning of traces 204 can be considered formation of a patterned mask (220 of FIGS. 12 and 13) over portions of expanse 204 while leaving other portions exposed, and subsequently subjecting the exposed portion to suitable etching conditions to remove the exposed portion. The portion covered by mask 220 in FIGS. 12 and 13 can be considered a first portion of expanse 204, and the portion which is not covered can be considered a second portion, and such second portion has been removed in forming the structure of FIGS. 15 and 16. The etch utilized to remove portions of expanse 204 can be any suitable etch.

Although mask 220 is shown removed in the exemplary processing of FIGS. 12-17, it is to be understood that the invention encompasses other aspects (not shown) in which the mask remains over circuit traces 222, 224, 226 and 228 at the processing stage of FIGS. 15 and 16. In such aspects, the mask can remain in subsequent processing in which the adhesive 16 (FIG. 2) and semiconductor die 12 (FIG. 2) are formed over the circuit traces. In such aspects, the interposer will actually comprise two dielectric materials, the dielectric material 202 and the dielectric material of mask 220. However, it is generally preferred that the interposer comprise only one dielectric material, and accordingly it is preferred that the mask 220 be removed after the processing to form circuit traces from conductive expanse 204.

Although the substrate 202 is shown patterned prior to patterning of expanse 204, it is to be understood that the invention encompasses other aspects (not shown) in which expanse 204 is patterned prior to the patterning of expanse 202. In such aspects, material 204 would be patterned prior to formation of contact pads 216 The contact pads 216 may then be formed by other methodology besides electrolytic plating, or, if electrolytic plating is used it may be desirable to form electrically conductive buses extending between the patterned circuit traces and a power source to provide appropriate power to the individual traces for the electrolytic plating operation.

Figure 18:
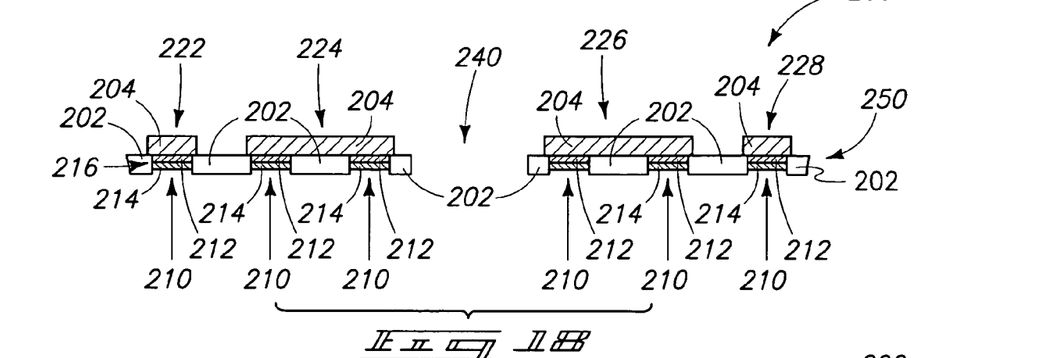
FIGS. 18-20 are a diagrammatic cross-sectional side view, fragmentary top view and fragmentary bottom view of the interposer assembly of FIGS. 3-5 shown at a processing stage subsequent to that of FIGS. 15-17. The view of FIG. 18 is along the lines 18-18 of FIGS. 19 and 20.
Figure 19:
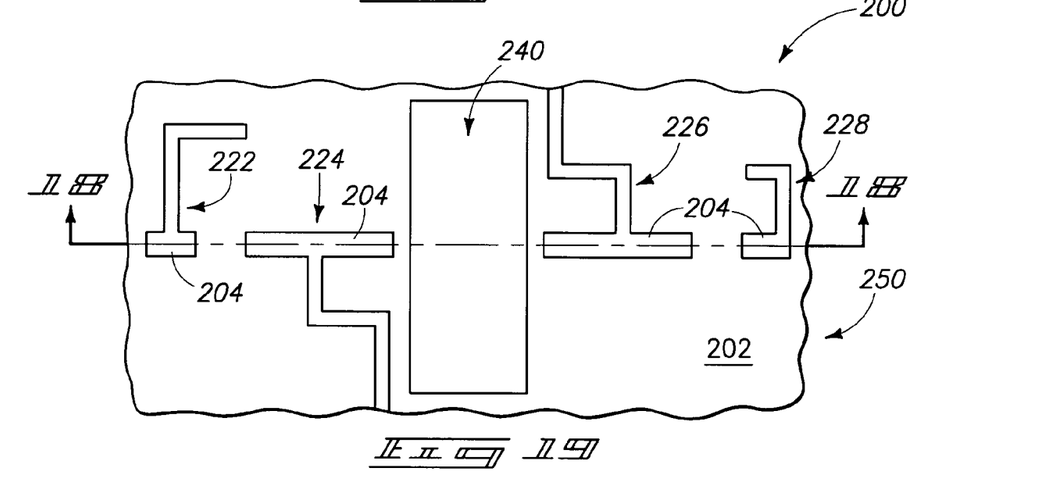
Figure 20:
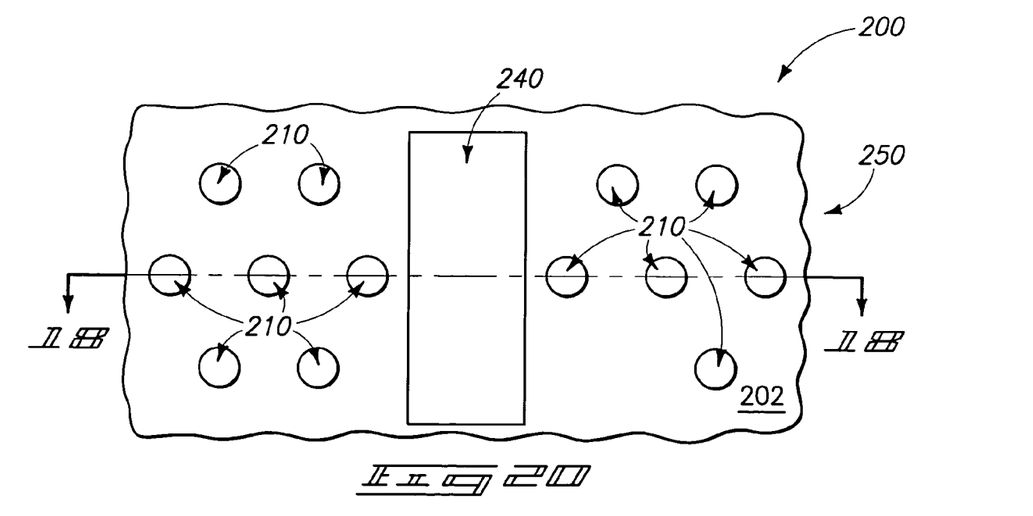

Referring to FIGS. 18-20, construction 200 is shown in cross-sectional side view, top view and bottom view, respectively, after formation of a slit 240 through a central region of dielectric material 202. Such slit can be formed by, for example, routing, etching or mechanical punching. The dielectric material 202 and conductive material 204 of FIGS. 18-20 together form an interposer 250. Such interposer comprises only a single dielectric material (202) laminated to conductive material 204 of the circuit traces. Such is an exemplary aspect of the invention. In other aspects of the invention discussed above (not shown), mask material 220 can remain over traces 222, 224, 226 and 228, and accordingly in such other aspects conductive material 204 can be laminated to two dielectric materials (202 and 220). In the shown exemplary aspect, slit 240 is formed while patterned electrically conductive material 204 is laminated only to the single dielectric material 202.

The interposer 250 is identical to the interposer 104 discussed above with reference to FIG. 2, and accordingly can be utilized in the construction 100 of FIG. 2. Incorporation of the interposer 250 into the construction of FIG. 2 comprises formation of adhesive structure 16 over the interposer, and subsequently adhering integrated circuit die 12 to the adhesive structure 16. In some aspects, the adhesive structure 16 can be considered a dielectric material which is formed in direct contact with both the surface 207 of expanse 204 and the semiconductor die. In such aspects, the dielectric material 16 can correspond to a tape having adhesive on opposing sides, with one of the opposing sides being in direct contact with the surface 207 of electrically-conductive expanse 204 and the other of the opposing sides of the tape being in direct contact with a surface of an integrated circuit die. In other aspects, the dielectric material 16 can be initially provided as a liquid between the integrated circuit die and the circuit traces formed from conductive material 204, and the liquid can then be cured to form a dielectric matrix 16 extending between the integrated circuit die and the conductive material 204. In such aspects, the dielectric material can correspond to a glue, for example.

Incorporation of interposer 250 into the construction 100 of FIG. 2 can further comprise forming one or more wire bonds to extend from a semiconductor die (such as the die 12 of FIG. 2) through the slit 240, and into electrical contact with one or more of the contact pads 216.

Figure 21:
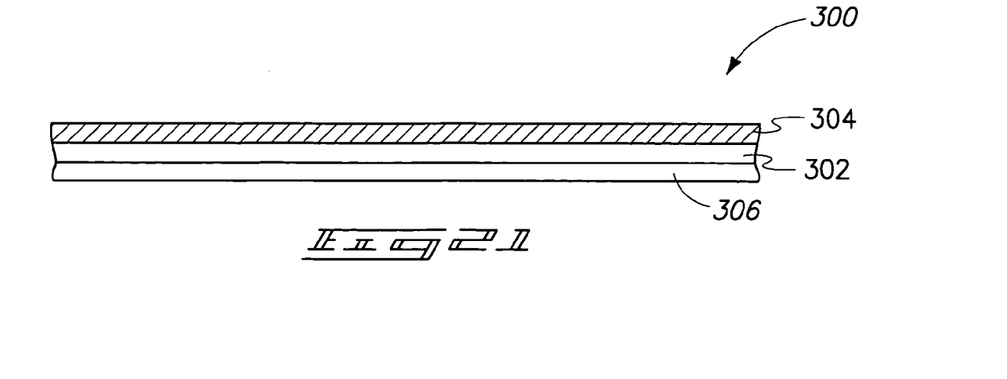
FIG. 21 is a diagrammatic cross-sectional side view of an interposer construction at a preliminary processing stage in accordance with a second aspect of the present invention.

The methodology of FIGS. 3-20 is one exemplary aspect by which an interposer of the present invention can be formed. FIGS. 21-24 illustrate another exemplary aspect by which an interposer can be formed. Referring initially to FIG. 21, a construction 300 is illustrated at a preliminary processing stage. Construction 300 comprises a dielectric core material 302 sandwiched between a pair of electrically conductive layers 304 and 306. Layers 304 and 306 can be copper-containing layers, and accordingly can comprise, consist essentially of, or consist of copper. Dielectric material 304 can be a polyimide core, a glass weave material, or any other dielectric core material. Construction 300 can be readily commercially obtained, and can correspond to a construction frequently utilized for forming interposers for flip-chip-in-package-board-on-chip (FCIP-BOC) packages.

Figure 22:
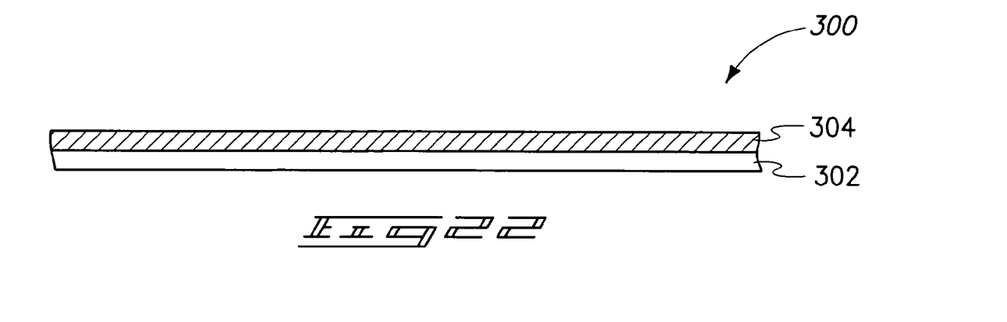
FIG. 22 is a view of the FIG. 21 construction shown at a processing stage subsequent to that of FIG. 21.

Referring next to FIG. 22, the layer 306 (FIG. 21) is removed to leave a single electrically-conductive expanse 304 over dielectric core material 302.

Figure 23:
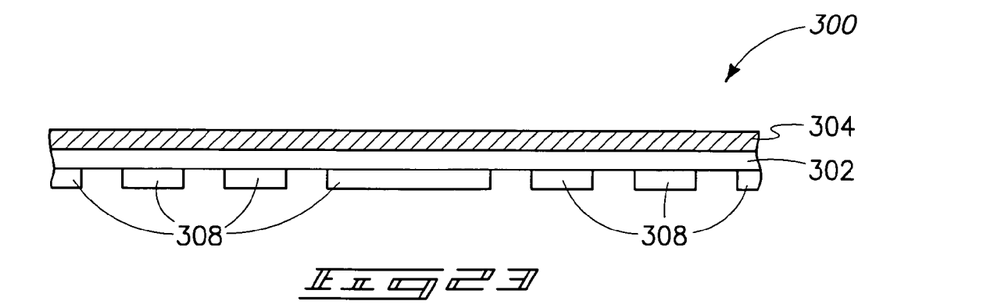
FIG. 23 is a view of the FIG. 21 construction shown at a processing stage subsequent to that of FIG. 22.

Referring to FIG. 23, a patterned masking material 308 is provided over an exposed surface of dielectric material 302. Patterned masking material 308 can be a photolithographically patterned photosensitive material, such as, for example, a photoresist or a dry film photomask.

Figure 24:
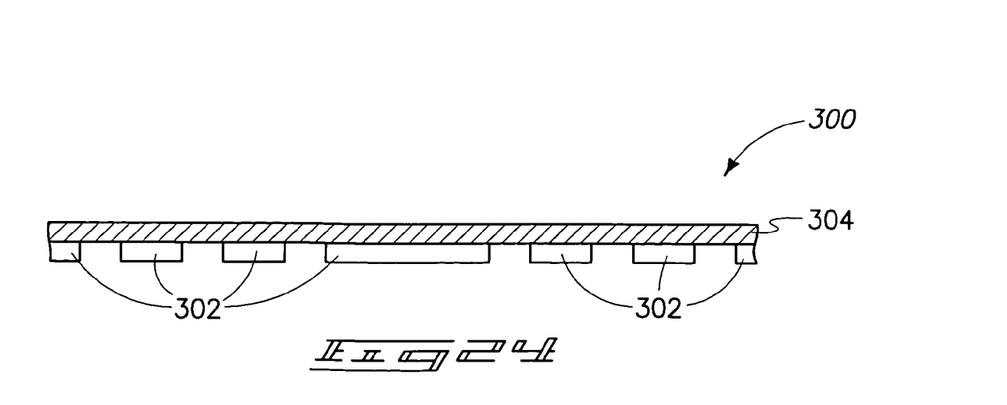
FIG. 24 is a view of the FIG. 21 construction shown at a processing stage subsequent to that of FIG. 23.

Referring to FIG. 24, a pattern is transferred from masking material 308 to material 302, and subsequently masking material 308 is removed. The structure 300 at the processing stage of FIG. 24 is similar to the structure 200 at the processing stage of FIG. 6, and specifically comprises a patterned mask material (302 of FIG. 24 and 202 of FIG. 6) with a plurality of openings extending therethrough to an electrically-conductive expanse (304 of FIG. 24 and 204 of FIG. 6). The structure of FIG. 24 can be processed with methodology analogous to that of FIGS. 9-20 to form an interposer similar to the interposer 250 of FIGS. 18-20. Such interposer formed from the structure 300 of FIG. 24 will have a dielectric material 302 comprising polyimide, glass weave, or other suitable dielectric constructions.

The interposers of the present invention can provide several improvements over prior art interposers. For instance, interposers of the present invention can be fabricated to be relatively thin and low cost, and accordingly can be fabricated to superior design rules. The interposers of the present invention can have relatively few polymers therein, in that there is relatively little dielectric material in interposers of the present invention relative to prior art interposers, which can reduce problems associated with moisture absorption by the polymers and outgassing from the polymers. Interposers of the present invention can be produced in batch, tape or reel form. Further, since interposers of the present invention are relatively thin, they can be used to produce low profile electronics packaging. Also, the current paths in the interposers of the present invention can generate low inductance during operation, due to the thinness of the interposers. The interposers of the present invention can be easily configured with the die pad areas so that input/output devices can be routed to an integrated circuit package that includes the interposers.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor package, comprising:
   a patterned substrate having openings extending therethrough, the patterned substrate consisting of a dry film photomask;
   conductive circuit traces over and directly against the substrate, the circuit traces having portions extending over the openings;
   contact pads entirely contained within the openings and being in electrical connection with one or more of the circuit traces;
   a semiconductor die over the circuit traces; and
   a homogenous matrix directly contacting the circuit traces and also directly contacting the die, the homogeneous matrix being the bulk of material between the circuit traces and the die.

2. The semiconductor package of claim 1 wherein the circuit traces comprise patterned copper-containing material.

3. The semiconductor package of claim 1 further comprising solder balls extending within the openings and in direct contact with the contact pads.

* * * * *